United States Patent
Luo et al.

(10) Patent No.: US 9,608,798 B2
(45) Date of Patent: Mar. 28, 2017

(54) METHOD FOR PERFORMING PHASE SHIFT CONTROL FOR TIMING RECOVERY IN AN ELECTRONIC DEVICE, AND ASSOCIATED APPARATUS

(71) Applicant: MEDIATEK INC., Hsin-Chu (TW)

(72) Inventors: Yan-Bin Luo, Taipei (TW); Bo-Jiun Chen, New Taipei (TW); Ke-Chung Wu, New Taipei (TW); Yi-Chieh Huang, Hsinchu County (TW)

(73) Assignee: MEDIATEK INC., Hsin-Chu, Taiwan (CN)

( * ) Notice: Subject to any disclaimer, the term of this patent is extended or adjusted under 35 U.S.C. 154(b) by 0 days.

(21) Appl. No.: 15/194,509

(22) Filed: Jun. 27, 2016

(65) Prior Publication Data
US 2016/0308665 A1 Oct. 20, 2016

Related U.S. Application Data

(63) Continuation-in-part of application No. 14/968,926, filed on Dec. 15, 2015, now Pat. No. 9,473,129.
(Continued)

(51) Int. Cl.
*H04L 7/00* (2006.01)
*H04L 7/033* (2006.01)
(Continued)

(52) U.S. Cl.
CPC ....... *H04L 7/0087* (2013.01); *H03F 3/45475* (2013.01); *H03K 3/0322* (2013.01);
(Continued)

(58) Field of Classification Search
CPC ............. H04L 1/0026; H04L 25/03057; H04L 25/03343; H04L 25/03885; H04L 25/497; H04L 27/01; H04L 7/0337; H04W 52/20
See application file for complete search history.

(56) References Cited

U.S. PATENT DOCUMENTS

| 5,382,921 A | 1/1995 | Estrada |
| 5,920,220 A * | 7/1999 | Takao ................... H04L 7/0054 327/141 |

(Continued)

FOREIGN PATENT DOCUMENTS

| EP | 2 312 753 A1 | 4/2011 |
| WO | 0016331 A1 | 3/2000 |

OTHER PUBLICATIONS

O'Mahony, A Programmable Phase Rotator based on Time-Modulated Injection-Locking, 2010 Symposium on VLSI Circuits/Technical Digest of Technical Papers, pp. 45-46, 2010.
(Continued)

*Primary Examiner* — Freshteh N Aghdam
(74) *Attorney, Agent, or Firm* — Winston Hsu; Scott Margo (57) ABSTRACT

A method for performing phase shift control for timing recovery in an electronic device and an associated apparatus are provided, where the method includes: generating an output signal of an oscillator, wherein a phase shift of the output signal of the oscillator is controlled by selectively combining a set of clock signals into the oscillator according to a set of digital control signals, and the set of clock signals is obtained from a clock generator, wherein the phase shift corresponds to the set of digital control signals, and the set of digital control signals carries a set of digital weightings for selectively mixing the set of clock signals; and performing timing recovery and sampling on a receiver input signal of a receiver in the electronic device according to the output signal of the oscillator to reproduce data from the receiver input signal.

19 Claims, 6 Drawing Sheets

Related U.S. Application Data which is a continuation of application No. 14/294,130, filed on Jun. 2, 2014, now Pat. No. 9,246,480.

(60) Provisional application No. 62/298,440, filed on Feb. 22, 2016, provisional application No. 62/246,788, filed on Oct. 27, 2015.

(51) Int. Cl.
| | |
|---|---|
| H03L 7/08 | (2006.01) |
| H03L 7/081 | (2006.01) |
| H03F 3/45 | (2006.01) |
| H03K 3/03 | (2006.01) |
| H03K 5/131 | (2014.01) |
| H03K 5/00 | (2006.01) |

(52) U.S. Cl.
CPC ........... *H03K 5/131* (2013.01); *H03L 7/0807* (2013.01); *H03L 7/0814* (2013.01); *H04L 7/0331* (2013.01); *H03K 2005/00052* (2013.01); *H03K 2005/00058* (2013.01)

(56) References Cited

U.S. PATENT DOCUMENTS

| | | | |
|---|---|---|---|
| 6,393,083 | B1 | 5/2002 | Beukema |
| 6,617,936 | B2 | 9/2003 | Dally |
| 7,760,833 | B1 | 7/2010 | Brunner |
| 8,710,929 | B1 | 4/2014 | Naviasky |
| 2004/0158420 | A1 | 8/2004 | Kim |
| 2007/0277069 | A1* | 11/2007 | Bonneau .......... G01R 31/31709 714/733 |
| 2010/0039157 | A1* | 2/2010 | Kaeriyama ............... G06F 1/08 327/292 |
| 2013/0195234 | A1* | 8/2013 | Lee ....................... H03L 7/0814 375/355 |
| 2015/0188554 | A1 | 7/2015 | Chong |
| 2015/0349763 | A1 | 12/2015 | Luo |

OTHER PUBLICATIONS

Yi-Chieh Huang, Title: Clock Generator Using Resistive Components to Generate Sub-Gate Delays and/or Using Common-Mode Voltage Based Frequency-Locked Loop Circuit for Frequency Offset Reduction, pending U.S. Appl. No. 15/261,884, filed Sep. 10, 2016.

Masum Hossain et al, 7.4 Gb/s 6.8 mW Source Synchronous Receiver in 65 nm CMOS, IEEE Journal of Solid-State Circuits, vol. 46, No. 6, Jun. 2011, pp. 1337-1348, XP55313279.

Masum Hossain et al, A Fast-Lock, Jitter Filtering All-Digital DLL Based Burst-Mode Memory Interface, IEEE Journal of Solid-State Circuits, vol. 49, No. 4, Apr. 2014, pp. 1048-1062, XP011543999.

* cited by examiner

METHOD FOR PERFORMING PHASE SHIFT CONTROL FOR TIMING RECOVERY IN AN ELECTRONIC DEVICE, AND ASSOCIATED APPARATUS

CROSS REFERENCE TO RELATED APPLICATION

This application claims the benefit of U.S. Provisional Application No. 62/298,440, which was filed on Feb. 22, 2016, and is included herein by reference. In addition, this application claims the benefit of U.S. Provisional Application No. 62/246,788, which was filed on Oct. 27, 2015, and is included herein by reference. Additionally, this application is a continuation in part application and claims the benefit of U.S. Non-provisional application Ser. No. 14/968,926, which was filed on Dec. 15, 2015, and is included herein by reference. The U.S. Non-provisional application Ser. No. 14/968,926 is a continuation application and claims the benefit of U.S. Non-provisional application Ser. No. 14/294,130, now U.S. Pat. No. 9,246,480, which was filed on Jun. 2, 2014. All related applications are included herein by reference.

BACKGROUND

The present invention relates to maintaining linearity of the hardware circuitry for a wide frequency range, and more particularly, to a method for performing phase shift control for timing recovery in an electronic device, and an associated apparatus.

In ultra-high speed Serializer/Deserializer (SerDes) or Analog-to-Digital Convertor (ADC) applications, the sub-rate (e.g. half-rate, quarter-rate, oct-rate, etc.) Serdes or interleave ADC architecture may have become the main stream since it is possible to reduce the samplers timing budget or the noise specification requirement. While the techniques progresses, however, some problems such as some side effects may occur. For example, the related art may suffer from one or more of high power consumption, large area, and poor timing recovery. Thus, a novel method and associated architecture are required for achieving lower power consumption, smaller area, and better timing recovery.

SUMMARY

It is an objective of the claimed invention to provide a method for performing phase shift control for timing recovery in an electronic device, and an associated apparatus, in order to solve the above-mentioned problems.

It is another objective of the claimed invention to provide a method for performing phase shift control for timing recovery in an electronic device, and an associated apparatus, in order to guarantee the overall performance of the electronic device.

According to at least one preferred embodiment, a method for performing phase shift control in an electronic device is provided, where the method comprises the steps of: obtaining a set of clock signals corresponding to a set of phases; and controlling a phase shift of an output signal of an oscillator by selectively mixing the set of clock signals into the oscillator according to a set of digital control signals, wherein the phase shift corresponds to the set of digital control signals, and the set of digital control signals carries a set of digital weightings for selectively mixing the set of clock signals. More particularly, the oscillator may comprise a plurality of stages, and the step of controlling the phase shift of the output signal of the oscillator by selectively mixing the set of clock signals into the oscillator according to the set of digital control signals may further comprise: controlling the phase shift of the output signal of the oscillator by selectively mixing the set of clock signals into a specific stage of the plurality of stages according to the set of digital control signals.

According to at least one preferred embodiment, an apparatus for performing phase shift control in an electronic device is provided, where the apparatus comprises at least one portion of the electronic device. The apparatus comprises an oscillator, and further comprises at least one mixing circuit that is electrically connected to the oscillator. The oscillator is arranged to generate an output signal. In addition, the aforementioned at least one mixing circuit comprises a set of clock receiving terminals that is arranged to obtain a set of clock signals corresponding to a set of phases. Additionally, the aforementioned at least one mixing circuit is arranged to perform phase shift control on the output signal of the oscillator. For example, the aforementioned at least one mixing circuit may control a phase shift of the output signal of the oscillator by selectively mixing the set of clock signals into the oscillator according to a set of digital control signals, wherein the phase shift corresponds to the set of digital control signals, and the set of digital control signals carries a set of digital weightings for selectively mixing the set of clock signals. More particularly, the oscillator may comprise a plurality of stages, and the aforementioned at least one mixing circuit may control the phase shift of the output signal of the oscillator by selectively mixing the set of clock signals into a specific stage of the plurality of stages according to the set of digital control signals.

According to at least one preferred embodiment, a method for performing phase shift control for timing recovery in an electronic device is provided, where the method may comprise: generating an output signal of an oscillator, wherein a phase shift of the output signal of the oscillator is controlled by selectively combining a set of clock signals into the oscillator according to a set of digital control signals, and the set of clock signals is obtained from a clock generator, wherein the phase shift corresponds to the set of digital control signals, and the set of digital control signals carries a set of digital weightings for selectively mixing the set of clock signals; and performing timing recovery and sampling on a receiver input signal of a receiver in the electronic device according to the output signal of the oscillator to reproduce data from the receiver input signal, wherein the reproduced data are reproduced at a data bus of the receiver, and the set of digital control signals is generated according to feedback signals from the data bus. For example, the method may further comprise utilizing a digital low pass filter to perform digital low pass filtering on derivatives of the feedback signals to generate the set of digital control signals. For example, the method may further comprise utilizing a phase detector to perform phase detection on the feedback signals from the data bus of the receiver to generate phase detection results, wherein the derivatives of the feedback signals comprise the phase detection results. In some embodiments, the timing recovery and sampling may be performed with Analog-to-Digital Converters (ADCs) of an interleave ADC architecture or edge/data samplers of a Serializer/Deserializer (SerDes) architecture.

According to at least one preferred embodiment, an apparatus for performing phase shift control for timing recovery in an electronic device is provided, where the apparatus may comprise at least one portion (e.g. a portion or all) of the electronic device. For example, the apparatus may comprise an oscillator, and further comprise at least one mixing circuit that is electrically connected to the oscillator. The oscillator is arranged to generate an output signal, and the aforementioned at least one mixing circuit comprises a set of clock receiving terminals that is arranged to obtain a set of clock signals. In addition, the aforementioned at least one mixing circuit is arranged to perform phase shift control on the output signal of the oscillator. For example, the aforementioned at least one mixing circuit may control a phase shift of the output signal of the oscillator by selectively combining the set of clock signals into the oscillator according to a set of digital control signals, wherein the phase shift corresponds to the set of digital control signals, and the set of digital control signals carries a set of digital weightings for selectively mixing the set of clock signals. Additionally, the apparatus may further comprise a clock generator, and comprise a sampling circuit that is positioned in a receiver in the electronic device. The clock generator is arranged to generate the set of clock signals, and the sampling circuit is arranged to perform timing recovery and sampling on a receiver input signal of the receiver according to the output signal of the oscillator to reproduce data from the receiver input signal, wherein the reproduced data are reproduced at a data bus of the receiver, and the set of digital control signals is generated according to feedback signals from the data bus. For example, the apparatus may further comprise a digital low pass filter arranged to perform digital low pass filtering on derivatives of the feedback signals to generate the set of digital control signals. For example, the apparatus may further comprise a phase detector arranged to perform phase detection on the feedback signals from the data bus of the receiver to generate phase detection results, wherein the derivatives of the feedback signals comprise the phase detection results. In some embodiments, the sampling circuit may be implemented with ADCs of an interleave ADC architecture or edge/data samplers of a SerDes architecture.

It is an advantage of the present invention that the present invention method and the associated apparatus can guarantee the overall performance of the electronic device. In comparison with the related art, the present invention method and the associated apparatus can achieve lower power consumption, smaller area, and better timing recovery. As a result, the related art problems may no longer be an issue.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
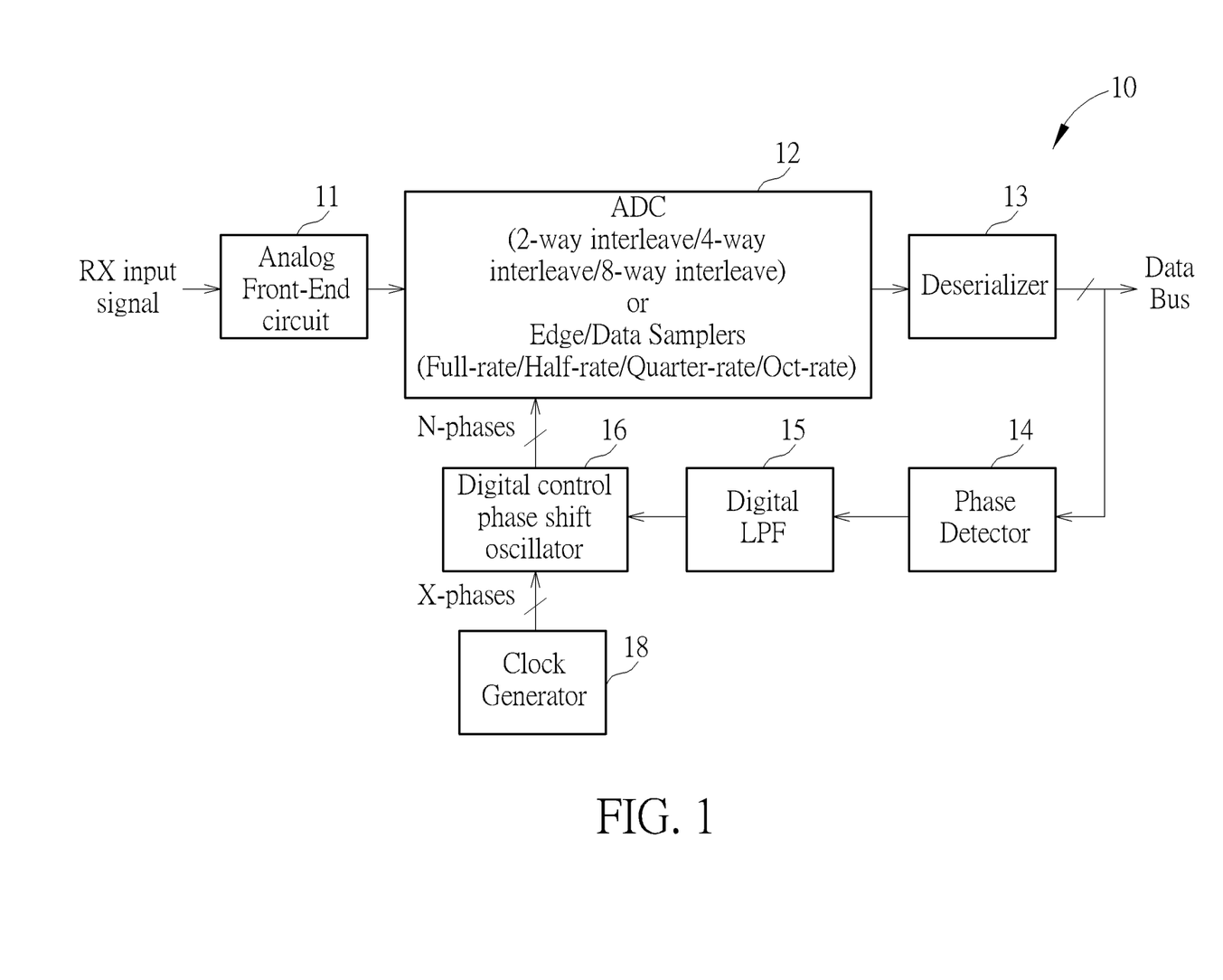
FIG. 1 is a diagram of an apparatus for performing phase shift control for timing recovery in an electronic device according to an embodiment of the present invention.

FIG. 1 illustrates a diagram of an apparatus 10 for performing phase shift control for timing recovery in an electronic device according to an embodiment of the present invention, where the apparatus 10 may comprise at least one portion (e.g. a portion or all) of the electronic device. For example, the apparatus 10 may comprise a portion of the electronic device mentioned above, and more particularly, can be at least one hardware circuit such as at least one integrated circuit (IC) within the electronic device and associated circuits thereof. In another example, the apparatus 10 can be the whole of the electronic device mentioned above. In another example, the apparatus 10 may comprise a system comprising the electronic device mentioned above (e.g. an audio/video system comprising the electronic device). Examples of the electronic device may include, but not limited to, a mobile phone (e.g. a multifunctional mobile phone), a tablet, and a personal computer such as a laptop computer.

As shown in FIG. 1, the apparatus 10 may comprise a sampling circuit 12 (labeled "ADC (2-way interleave/4-way interleave/8-way interleave) or Edge/Data Samplers (Full-rate/Half-rate/Quarter-rate/Oct-rate)" in FIG. 1, for better comprehension) that may be implemented with one of various types of sampling architectures. For example, the sampling circuit 12 may comprise Analog-to-Digital Converters (ADCs) of one of the 2-way interleave architecture, the 4-way interleave architecture, and the 8-way interleave architecture. In another example, the sampling circuit 12 may comprise edge/data samplers of one of the Full-rate architecture, the Half-rate (i.e. ½ rate) architecture, the Quarter-rate (i.e. ¼ rate) architecture, and the Oct-rate (i.e. ⅛ rate) architecture. In addition, the apparatus 10 may comprise an analog front-end circuit 11, a deserializer 13, a phase detector 14, a digital lower pass filter (LPF) 15, and at least one digital control phase shift oscillator (e.g. one or more digital control phase shift oscillators (DCPSOs)) that can be collectively referred to as the digital control phase shift oscillator 16, and may further comprise a clock generator 18. Additionally, the components of the architecture shown in FIG. 1 (e.g. the analog front-end circuit 11, the sampling circuit 12, the deserializer 13, the phase detector 14, the digital LPF 15, the digital control phase shift oscillator 16, and the clock generator 18) may be positioned in a receiver (RX) of the electronic device. The receiver may receive a receiver input signal (i.e. RX input signal) to obtain data carried by the receiver input signal. For example, a processing circuit in the electronic device may be coupled to the receiver through at least one data terminal (e.g. one or more data terminals) of the receiver, such as that of a data bus of the receiver, for performing further processing on the data output from the data bus. In some embodiments, the apparatus 10 may comprise only a portion of the architecture shown in FIG. 1. For example, the analog front-end circuit 11 and the deserializer 13 may be optional.

According to the embodiment shown in FIG. 1, internal components of the digital control phase shift oscillator 16 may comprise an oscillator, and may further comprise at least one mixing circuit (e.g. one or more mixing circuits) that is electrically connected to the oscillator. For example, the oscillator may be a ring oscillator, and may comprise a plurality of stages, which may be regarded as the oscillator circuit of the oscillator. The oscillator may generate one or more output signals, and the digital control phase shift oscillator 16 may shift the phase of any output signal within the one or more output signals. As a result, the digital control phase shift oscillator 16 may output one or more of the output signals having N phases (labeled "N-phases" in FIG. 1, for better comprehension), where the notation "N" may represent a positive integer. In this embodiment, the aforementioned at least one mixing circuit (e.g. one or more mixing circuits) may comprise a set of clock receiving terminals that is arranged to obtain a set of clock signals corresponding to a set of phases, such as those having X phases (labeled "X-phases" in FIG. 1, for better comprehension), where the notation "X" may represent a positive integer. For example, the clock generator 18 may generate the set of clock signals such as those having the X phases, and output the set of clock signals to the digital control phase shift oscillator 16. In addition, the aforementioned at least one mixing circuit may perform phase shift control on the output signal of the oscillator. For example, the aforementioned at least one mixing circuit may control a phase shift of the output signal of the oscillator by selectively combining the set of clock signals of the clock generator 18 into the oscillator within the digital control phase shift oscillator 16 according to a set of digital control signals from the digital LPF 15, where the phase shift corresponds to the set of digital control signals, and the set of digital control signals carries a set of digital weightings for selectively mixing the set of clock signals.

Based on the architecture shown in FIG. 1, the sampling circuit 12 may perform timing recovery and sampling on the receiver input signal according to the output signals of the digital control phase shift oscillator 16 (e.g. the aforementioned output signal of the oscillator therein) to reproduce the data from the receiver input signal, where the loop in the architecture shown in FIG. 1 (e.g. the loop formed with the sampling circuit 12, the deserializer 13, the phase detector 14, the digital LPF 15, and the digital control phase shift oscillator 16) may be regarded as a timing recovery loop, and the reproduced data may be reproduced at the aforementioned at least one data terminal of the receiver, such as the data terminals of the data bus of this embodiment. In addition, the set of digital control signals may be generated according to feedback signals from the data bus. For example, the digital LPF 15 may perform digital low pass filtering on derivatives of the feedback signals to generate the set of digital control signals. More particularly, the phase detector 14 may perform phase detection on the feedback signals from the data bus of the receiver to generate phase detection results, where the derivatives of the feedback signals may comprise the phase detection results.

Figure 2:
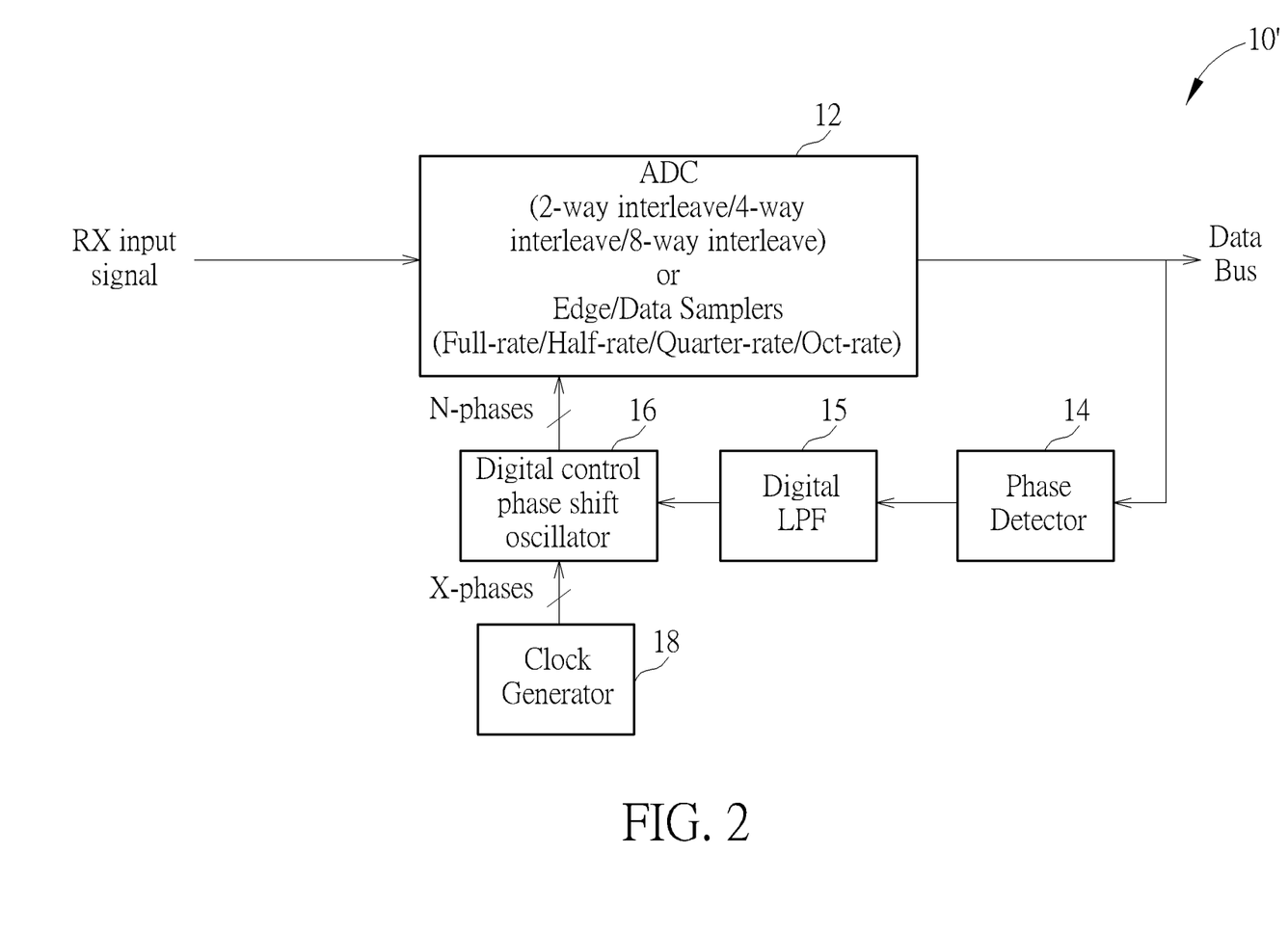
FIG. 2 is a diagram of an apparatus for performing phase shift control for timing recovery in an electronic device according to another embodiment of the present invention.

FIG. 2 illustrates a diagram of an apparatus 10' for performing phase shift control for timing recovery in an electronic device according to an embodiment of the present invention, where the apparatus 10' of this embodiment may comprise some of the components in the architecture shown in FIG. 1. In comparison with the architecture shown in FIG. 1, the analog front-end circuit 11 and the deserializer 13 mentioned above may be omitted in this embodiment. In addition, the sampling circuit 12 may directly receive the receiver input signal, and the data bus may become serial (rather than parallel) in this embodiment. Additionally, the phase detector 14 may be electrically connected to the sampling circuit 12, directly. For example, the processing circuit in the electronic device may be coupled to the receiver through the aforementioned at least one data terminal of the receiver, such as the data terminal of the data bus of this embodiment, for performing further processing on the data output from the data bus.

Based on the architecture shown in FIG. 2, the sampling circuit 12 may perform timing recovery and sampling on the receiver input signal according to the output signals of the digital control phase shift oscillator 16 (e.g. the aforementioned output signal of the oscillator therein) to reproduce the data from the receiver input signal, where the loop in the architecture shown in FIG. 2 (e.g. the loop formed with the sampling circuit 12, the phase detector 14, the digital LPF 15, and the digital control phase shift oscillator 16) may be regarded as a timing recovery loop, and the reproduced data may be reproduced at the aforementioned at least one data terminal of the receiver, such as the data terminal of the data bus of this embodiment. In addition, the set of digital control signals may be generated according to a feedback signal from the data bus. For example, the digital LPF 15 may perform digital low pass filtering on derivatives of the feedback signal to generate the set of digital control signals. More particularly, the phase detector 14 may perform phase detection on the feedback signal from the data bus of the receiver to generate phase detection results, where the derivatives of the feedback signal may comprise the phase detection results.

According to some embodiments, such as any of the embodiments respectively shown in FIGS. 1-2, the digital control phase shift oscillator (DCPSO) 16 may be implemented according to the teachings in the U.S. Non-provisional application Ser. No. 14/968,926 (e.g. an apparatus for performing phase shift control in an electronic device in one or more of the embodiments of the U.S. Non-provisional application Ser. No. 14/968,926, such as the apparatus 100 shown in FIG. 1 thereof, the architecture shown in any of FIGS. 3-4 thereof, the DCPSO shown in any of FIGS. 5-6 thereof, the apparatus 100SE shown in FIG. 7 thereof, the apparatus 100DF shown in FIG. 8 thereof, the apparatus 100SE' shown in FIG. 9 thereof, or the apparatus 100DF' shown in FIG. 10 thereof). Please refer to the U.S. Non-provisional application Ser. No. 14/968,926 for some implementation details.

With aid of the digital control phase shift oscillator 16, the present invention apparatus (e.g. the apparatus 10 or the apparatus 10') and the associated method (e.g. a method for controlling operations of the apparatus 10 or the apparatus 10') can guarantee the overall performance of the electronic device. In comparison with the related art, the present invention method and the associated apparatus can achieve lower power consumption, smaller area, and better timing recovery. As a result, the related art problems may no longer be an issue.

Figure 3:
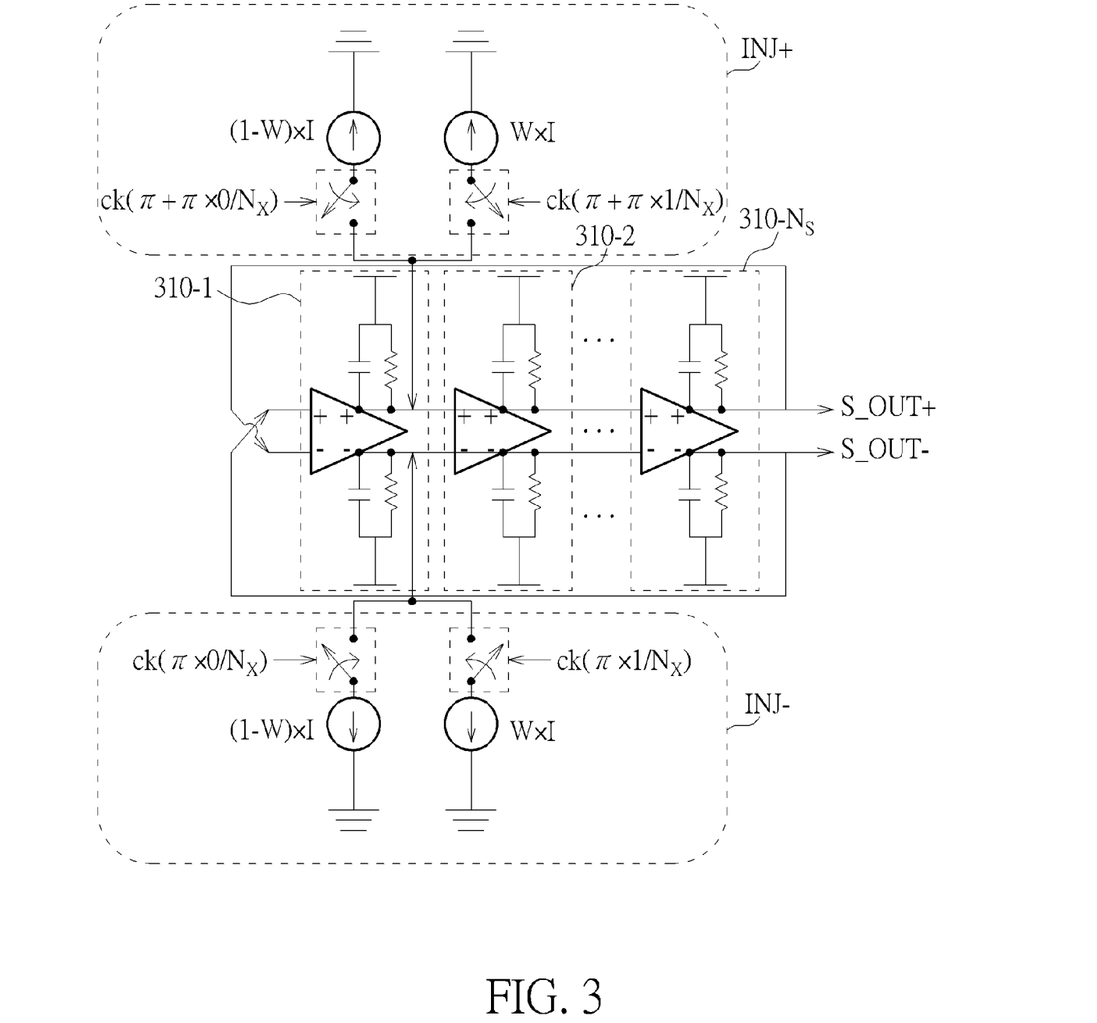
FIG. 3 illustrates a current mode control scheme involved with the digital control phase shift oscillator shown in any of FIGS. 1-2 according to an embodiment of the present invention.

FIG. 3 illustrates a current mode control scheme involved with the digital control phase shift oscillator 16 shown in any of FIGS. 1-2 according to an embodiment of the present invention, where the stages 310-1, 310-2, ..., and 310-$N_S$ can be taken as an example of the plurality of stages within the digital control phase shift oscillator 16 shown in any of FIGS. 1-2. In this embodiment, each stage of the plurality of stages in the digital control phase shift oscillator 16, such as any of the stages 310-1, 310-2, ..., and 310-$N_S$ shown in FIG. 3, may comprise a current mode amplifier. According to some embodiments, each stage of the plurality of stages in the digital control phase shift oscillator 16 may comprise a voltage mode amplifier. According to some embodiments, each stage of the plurality of stages may comprise a differential amplifier. According to some embodiments, each stage of the plurality of stages may comprise a single-end amplifier.

According to this embodiment, the aforementioned at least one mixing circuit such as the injection circuits INJ+ and INJ− shown in FIG. 3 may comprise a set of adjustable current sources, such as the two current sources shown around the uppermost of FIG. 3 and the two current sources shown around the lowermost of FIG. 3, and may further comprise a set of switching units, such as those next to the adjustable current sources shown in FIG. 3, respectively. For example, the set of switching units is coupled between the set of adjustable current sources and the oscillator circuit (which may comprise the plurality of stages) of this embodiment, and more particularly, is coupled between the set of adjustable current sources and at least one stage (e.g. one or more stages) of the stages 310-1, 310-2, ..., and 310-$N_S$, where the set of clock receiving terminals for obtaining the set of clock signals can be the switching control terminals of these switching units, respectively. In addition, the clock signal ck($\pi+\pi^*(0/N_X)$) having the phase of ($\pi+\pi^*(0/N_X)$), the clock signal ck($\pi+\pi^*(1/N_X)$) having the phase of ($\pi+\pi^*(1/N_X)$), the clock signal ck($\pi^*(0/N_X)$) having the phase of (n*(0/$N_X$)), and the clock signal ck($\pi^*(1/N_X)$) having the phase of ($\pi^*(1/N_X)$) that are shown in FIG. 3 can be taken as an example of the set of clock signals.

According to this embodiment, the apparatus 10 may utilize the set of adjustable current sources respectively corresponding to the set of clock signals such as the clock signal ck($\pi+\pi^*(0/N_X)$), the clock signal ck($\pi+\pi^*(1/N_X)$), the clock signal ck($\pi^*(0/N_X)$), and the clock signal ck($\pi^*(1/N_X)$), to selectively mix the set of clock signals into the oscillator circuit according to the set of digital weighting control signals. For example, the set of digital weighting control signals of this embodiment may carry the set of digital weightings such as the digital weightings {{(1−W), W}, {(1−W), W}}, and therefore, the set of adjustable current sources respectively corresponding to the set of clock signals such as the clock signal ck($\pi+\pi^*(0/N_X)$), the clock signal ck($\pi+\pi^*(1/N_X)$), the clock signal ck($\pi^*(0/N_X)$), and the clock signal ck($\pi^*(1/N_X)$) may generate the currents of ((1−W)*I), (W*I), ((1−W)*I), and (W*I), respectively. In addition, the set of adjustable current sources is controlled by the set of digital weighting control signals, and each adjustable current source of the set of adjustable current sources selectively mixes a corresponding clock signal of the set of clock signals, such as the corresponding clock signal within the clock signal ck($\pi+\pi^*(0/N_X)$), the clock signal ck($\pi+\pi^*(1/N_X)$), the clock signal ck($\pi^*(0/N_X)$), and the clock signal ck($\pi^*(1/N_X)$), into the oscillator circuit according to a corresponding digital weighting control signal of the set of digital weighting control signals, such as the corresponding digital weighting control signal within the digital weighting control signals carrying the digital weightings {{(1−W), W}, {(1−W), W}}.

Please note that, in the embodiment shown in FIG. 3, each stage of the plurality of stages within the digital control phase shift oscillator 16, such as any of the stages 310-1, 310-2, ..., and 310-$N_S$ shown in FIG. 3, may comprise a differential amplifier, where at least one portion (e.g. a portion or all) of the set of differential output signals S_OUT+ and S_OUT− shown in FIG. 3, such as any or both of the differential output signals S_OUT+ and S_OUT−, can be taken as an example of the output signal(s) in the embodiments shown in FIGS. 1-2. For brevity, similar descriptions for this embodiment are not repeated in detail here.

According to some embodiments, each stage of the plurality of stages within the digital control phase shift oscillator 16, such as any of the stages 310-1, 310-2, ..., and 310-$N_S$ shown in FIG. 3, may comprise a single-end amplifier. For brevity, similar descriptions for these embodiments are not repeated in detail here.

In general, the number $N_S$ of stages within the stages 310-1, 310-2, ..., and 310-$N_S$ may be unrelated to the number N of phases within the N phases mentioned above. For example, the number $N_S$ of stages within the stages 310-1, 310-2, ..., and 310-$N_S$ of some embodiments may be different from the number N of phases within the N phases. This is for illustrative purposes only, and is not meant to be a limitation of the present invention. In some other embodiments, the number $N_S$ of stages within the stages 310-1, 310-2, ..., and 310-$N_S$ may be the same as the number N of phases within the N phases.

In addition, the phase parameter $N_X$ regarding the phases of some clock signals described above (e.g. the clock signal ck($\pi+\pi^*(0/N_X)$) having the phase of ($\pi+\pi^*(0/N_X)$), the clock signal ck($\pi+\pi^*(1/N_X)$) having the phase of ($\pi+\pi^*(1/N_X)$), the clock signal ck($\pi^*(0/N_X)$) having the phase of ($\pi^*(0/N_X)$), and the clock signal ck($\pi^*(1/N_X)$) having the phase of ($\pi^*(1/N_X)$) that are shown in FIG. 3) may be related to the number X of phases within the X phases mentioned above. For example, the phase parameter $N_X$ regarding the phases of these clock signals in some embodiments may be the same as the number X of phases within the X phases. This is for illustrative purposes only, and is not meant to be a limitation of the present invention. In some other embodiments, the phase parameter $N_X$ regarding the phases of these clock signals may be different from the number X of phases within the X phases.

Additionally, the phase parameter $N_X$ regarding the phases of some clock signals described above (e.g. the clock signal ck($\pi+\pi^*(0/N_X)$) having the phase of ($\pi+\pi^*(0/N_X)$), the clock signal ck($\pi+\pi^*(1/N_X)$) having the phase of ($\pi+\pi^*(1/N_X)$), the clock signal ck($\pi^*(0/N_X)$) having the phase of ($\pi^*(0/N_X)$), and the clock signal ck($\pi^*(1/N_X)$) having the phase of ($\pi^*(1/N_X)$) that are shown in FIG. 3) may be unrelated to the number N of phases within the N phases mentioned above. For example, the phase parameter $N_X$ regarding the phases of these clock signals in some embodiments may be different from the number N of phases within the N phases. This is for illustrative purposes only, and is not meant to be a limitation of the present invention. In some other embodiments, the phase parameter $N_X$ regarding the phases of these clock signals may be the same as the number N of phases within the N phases.

Figure 4:
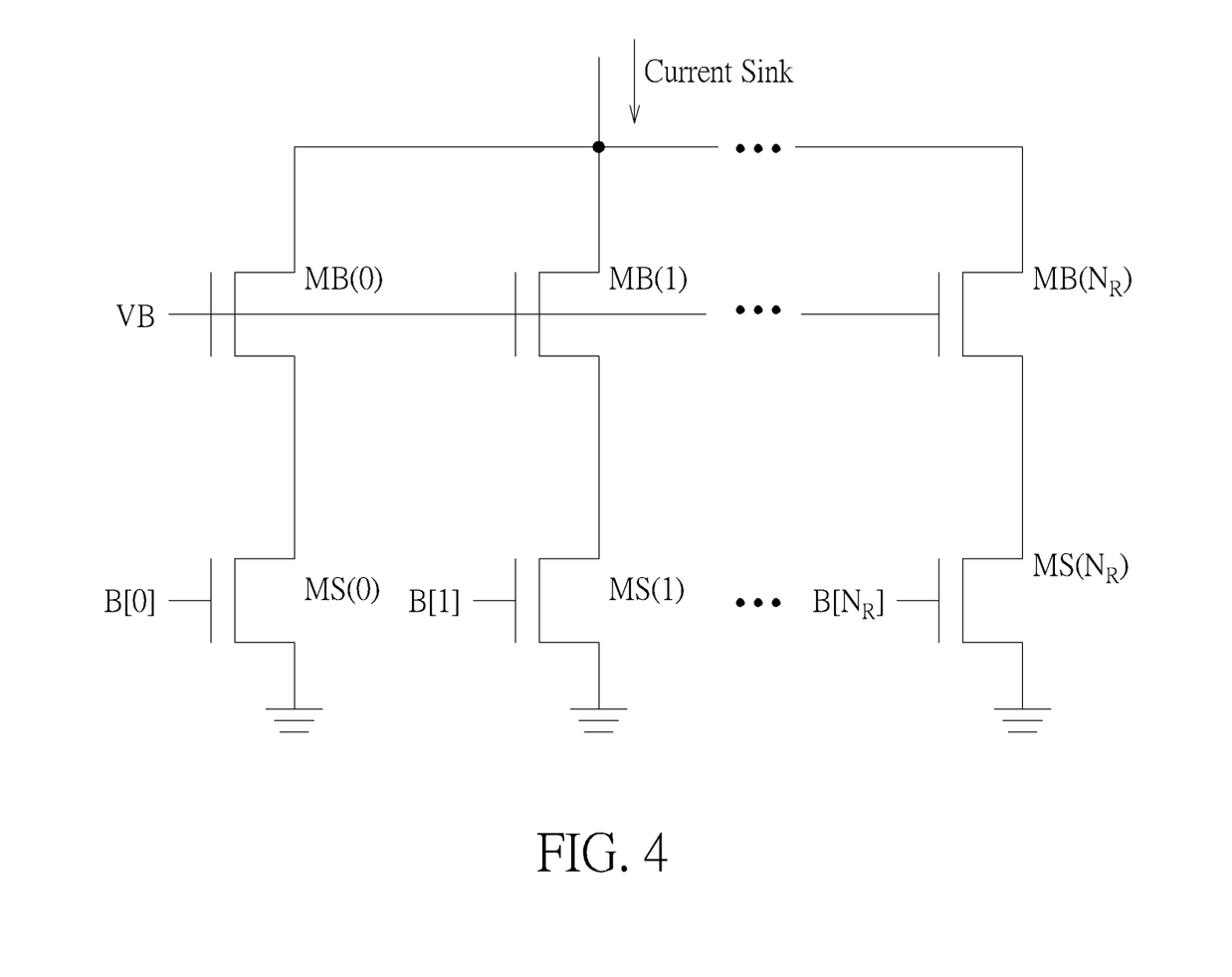
FIG. 4 illustrates a sub-circuit of one of the injection circuits shown in FIG. 3 according to an embodiment of the present invention.

FIG. 4 illustrates a sub-circuit of one of the injection circuits INJ+ and INJ− shown in FIG. 3 according to an embodiment of the present invention. The sub-circuit shown in FIG. 4 can be utilized for implementing any of the two branches in the injection circuit INJ+ (e.g. the left branch and the right branch of the injection circuit INJ+, respectively), and can be utilized for implementing any of the two branches in the injection circuit INJ− (e.g. the left branch and the right branch of the injection circuit INJ−, respectively). For example, four copies of the architecture shown in FIG. 4, such as a first sub-circuit, a second sub-circuit, a third sub-circuit, and a fourth sub-circuit, can be utilized for implementing the left branch of the two branches in the injection circuit INJ+, the right branch of the two branches in the injection circuit INJ+, the left branch of the two branches in the injection circuit INJ−, and the right branch of the two branches in the injection circuit INJ−, respectively.

Regarding the first sub-circuit, the terminal VB thereof may receive the clock signal $ck(\pi+\pi^*(0/N_X))$ having the phase of $(\pi+\pi^*(0/N_X))$, and the $(N_R+1)$ switches {MB(0), MB(1), ..., MB($N_R$)} thereof (e.g. $(N_R+1)$ Metal Oxide Semiconductor Field Effect Transistors (MOSFETs)) may perform switching operations according to the clock signal $ck(\pi+\pi^*(0/N_X))$. In addition, the terminals {B[0], B[1], ..., B[$N_R$]} thereof may receive the digital weighting control signals corresponding to the left branch of the two branches in the injection circuit INJ+, and the digital weighting (1−W) for this branch may be equivalent to the ratio of the number $N_{R-ON}(1)$ of turn-on switch(es) within the $(N_R+1)$ switches {MS(0), MS(1), ..., MS($N_R$)} thereof (e.g. $(N_R+1)$ MOSFETs) to the number $(N_R+1)$ of all of these $(N_R+1)$ switches {MS(0), MS(1), ..., MS($N_R$)}, where the notation "$N_{R-ON}(1)$" may represent an integer that falls within the range of the interval [0, $N_R+1$]. For example, suppose that the digital weighting (1−W) for this branch is not equal to zero. As a result, the number $N_{R-ON}(1)$ may be a positive integer that falls within the range of the interval [1, $N_R+1$]. In another example, suppose that each of the digital weighting (1−W) for this branch and the digital weighting W for the other branch within the two branches in the injection circuit INJ+ is not equal to zero. As a result, the number $N_{R-ON}(1)$ may be a positive integer that falls within the range of the interval [1, $N_R$].

Regarding the second sub-circuit, the terminal VB thereof may receive the clock signal $ck(\pi+\pi^*(1/N_X))$ having the phase of $(\pi+\pi^*(1/N_X))$, and the $(N_R+1)$ switches {MB(0), MB(1), ..., MB($N_R$)} thereof (e.g. $(N_R+1)$ MOSFETs) may perform switching operations according to the clock signal $ck(\pi+\pi^*(1/N_X))$. In addition, the terminals {B[0], B[1], ..., B[$N_R$]} thereof may receive the digital weighting control signals corresponding to the right branch of the two branches in the injection circuit INJ+, and the digital weighting W for this branch may be equivalent to the ratio of the number $N_{R-ON}(2)$ of turn-on switch(es) within the $(N_R+1)$ switches {MS(0), MS(1), ..., MS($N_R$)} thereof (e.g. $(N_R+1)$ MOSFETs) to the number $(N_R+1)$ of all of these $(N_R+1)$ switches {MS(0), MS(1), ..., MS($N_R$)}, where the notation "$N_{R-ON}(2)$" may represent an integer that falls within the range of the interval [0, $N_R+1$]. For example, suppose that the digital weighting W for this branch is not equal to zero. As a result, the number $N_{R-ON}(2)$ may be a positive integer that falls within the range of the interval [1, $N_R+1$]. In another example, suppose that each of the digital weighting W for this branch and the digital weighting (1−W) for the other branch within the two branches in the injection circuit INJ+ is not equal to zero. As a result, the number $N_{R-ON}(2)$ may be a positive integer that falls within the range of the interval [1, $N_R$].

Regarding the third sub-circuit, the terminal VB thereof may receive the clock signal $ck(\pi^*(0/N_X))$ having the phase of $(\pi^*(0/N_X))$, and the $(N_R+1)$ switches {MB(0), MB(1), ..., MB($N_R$)} thereof (e.g. $(N_R+1)$ MOSFETs) may perform switching operations according to the clock signal $ck(\pi^*(0/N_X))$. In addition, the terminals {B[0], B[1], ..., B[$N_R$]} thereof may receive the digital weighting control signals corresponding to the left branch of the two branches in the injection circuit INJ−, and the digital weighting (1−W) for this branch may be equivalent to the ratio of the number $N_{R-ON}(3)$ of turn-on switch(es) within the $(N_R+1)$ switches {MS(0), MS(1), ..., MS($N_R$)} thereof (e.g. $(N_R+1)$ MOSFETs) to the number $(N_R+1)$ of all of these $(N_R+1)$ switches {MS(0), MS(1), MS($N_R$)}, where the notation "$N_{R-ON}(3)$" may represent an integer that falls within the range of the interval [0, $N_R+1$]. For example, suppose that the digital weighting (1−W) for this branch is not equal to zero. As a result, the number $N_{R-ON}(3)$ may be a positive integer that falls within the range of the interval [1, $N_R+1$]. In another example, suppose that each of the digital weighting (1−W) for this branch and the digital weighting W for the other branch within the two branches in the injection circuit INJ− is not equal to zero. As a result, the number $N_{R-ON}(3)$ may be a positive integer that falls within the range of the interval [1, $N_R$].

Regarding the fourth sub-circuit, the terminal VB thereof may receive the clock signal $ck(\pi^*(1/N_X))$ having the phase of $(\pi^*(1/N_X))$, and the $(N_R+1)$ switches {MB(0), MB(1), ..., MB($N_R$)} thereof (e.g. $(N_R+1)$ MOSFETs) may perform switching operations according to the clock signal $ck(\pi^*(1/N_X))$. In addition, the terminals {B[0], B[1], ..., B[$N_R$]} thereof may receive the digital weighting control signals corresponding to the right branch of the two branches in the injection circuit INJ−, and the digital weighting W for this branch may be equivalent to the ratio of the number $N_{R-ON}(4)$ of turn-on switch(es) within the $(N_R+1)$ switches {MS(0), MS(1), ..., MS($N_R$)} thereof (e.g. $(N_R+1)$ MOSFETs) to the number $(N_R+1)$ of all of these $(N_R+1)$ switches {MS(0), MS(1), ..., MS($N_R$)}, where the notation "$N_{R-ON}(4)$" may represent an integer that falls within the range of the interval [0, $N_R+1$]. For example, suppose that the digital weighting W for this branch is not equal to zero. As a result, the number $N_{R-ON}(4)$ may be a positive integer that falls within the range of the interval [1, $N_R+1$]. In another example, suppose that each of the digital weighting W for this branch and the digital weighting (1−W) for the other branch within the two branches in the injection circuit INJ− is not equal to zero. As a result, the number $N_{R-ON}(4)$ may be a positive integer that falls within the range of the interval [1, $N_R$].

According to this embodiment, each of the first sub-circuit, the second sub-circuit, the third sub-circuit, and the fourth sub-circuit mentioned above can be regarded as a current sink. As a result of utilizing the of the first sub-circuit, the second sub-circuit, the third sub-circuit, and the fourth sub-circuit, the injection circuits INJ+ and INJ− shown in FIG. 3 may selectively mix the set of clock signals such as the clock signal $ck(\pi+\pi^*(0/N_X))$, the clock signal $ck(\pi+\pi^*(1/N_X))$, the clock signal $ck(\pi^*(0/N_X))$, and the clock signal $ck(\pi^*(1/N_X))$ into the oscillator circuit according to the set of digital weighting control signals such as the digital weighting control signals carrying the digital weightings {{(1−W), W}, {(1−W), W}}, respectively. For brevity, similar descriptions for this embodiment are not repeated in detail here.

In general, the number ($N_R+1$) of sub-paths corresponding to the ($N_R+1$) switches {MS(0), MS(1), ..., MS($N_R$)} may be unrelated to the number N of phases within the N phases mentioned above. For example, the number ($N_R+1$) of sub-paths corresponding to the ($N_R+1$) switches {MS(0), MS(1), ..., MS($N_R$)} of some embodiments may be different from the number N of phases within the N phases. This is for illustrative purposes only, and is not meant to be a limitation of the present invention. In some other embodiments, the number ($N_R+1$) of sub-paths corresponding to the ($N_R+1$) switches {MS(0), MS(1), ..., MS($N_R$)} may be the same as the number N of phases within the N phases.

In addition, the number ($N_R+1$) of sub-paths corresponding to the ($N_R+1$) switches {MS(0), MS(1), ..., MS($N_R$)} may be unrelated to the phase parameter $N_X$ regarding the phases of some clock signals described above (e.g. the clock signal $ck(\pi+\pi*(0/N_X))$ having the phase of $(\pi+\pi*(0/N_X))$, the clock signal $ck(\pi+\pi*(1/N_X))$ having the phase of $(\pi+\pi*(1/N_X))$, the clock signal $ck(\pi*(0/N_X))$ having the phase of $(\pi*(0/N_X))$, and the clock signal $ck(\pi*(1/N_X))$ having the phase of $(\pi*(1/N_X))$ that are shown in FIG. 3). For example, the number ($N_R+1$) of sub-paths corresponding to the ($N_R+1$) switches {MS(0), MS(1), ..., MS($N_R$)} of some embodiments may be different from the phase parameter $N_X$ regarding the phases of these clock signals. This is for illustrative purposes only, and is not meant to be a limitation of the present invention. In some other embodiments, the number ($N_R+1$) of sub-paths corresponding to the ($N_R+1$) switches {MS(0), MS(1), ..., MS($N_R$)} may be the same as the phase parameter $N_X$ regarding the phases of these clock signals.

According to some embodiments, the phase shift of the output signal of the oscillator (more particularly, the oscillator circuit) within the digital control phase shift oscillator 16 may be controlled by selectively combining the set of clock signals into a specific stage of the plurality of stages according to the set of digital control signals. For example, the phase shift of the output signal of the oscillator (more particularly, the oscillator circuit) within the digital control phase shift oscillator 16 may be controlled by injecting at least one portion (e.g. a portion or all) of the set of clock signals into the specific stage according to the set of digital control signals, where the signal count of the aforementioned at least one portion of the set of clock signals corresponds to the set of digital weightings carried by the set of digital control signals. For brevity, similar descriptions for these embodiments are not repeated in detail here.

According to some embodiments, the phase shift of the output signal of the oscillator (more particularly, the oscillator circuit) within the digital control phase shift oscillator 16 may be controlled by selectively combining the set of clock signals into the specific stage of the plurality of stages according to the set of digital control signals and by selectively combining another set of clock signals into another stage of the plurality of stages according to another set of digital control signals. For example, the phase shift of the output signal of the oscillator (more particularly, the oscillator circuit) within the digital control phase shift oscillator 16 may be controlled by injecting at least one portion (e.g. a portion or all) of the set of clock signals into the specific stage of the plurality of stages according to the set of digital control signals and by injecting at least one portion (e.g. a portion or all) of the other set of clock signals into the other stage of the plurality of stages according to the other set of digital control signals, where the signal count of the aforementioned at least one portion of the set of clock signals corresponds to the set of digital weightings carried by the set of digital control signals, and the signal count of the aforementioned at least one portion of the other set of clock signals corresponds to a set of digital weightings carried by the other set of digital control signals. For example, the other set of clock signals may be equivalent to the set of clock signals. For brevity, similar descriptions for these embodiments are not repeated in detail here.

Figure 5:
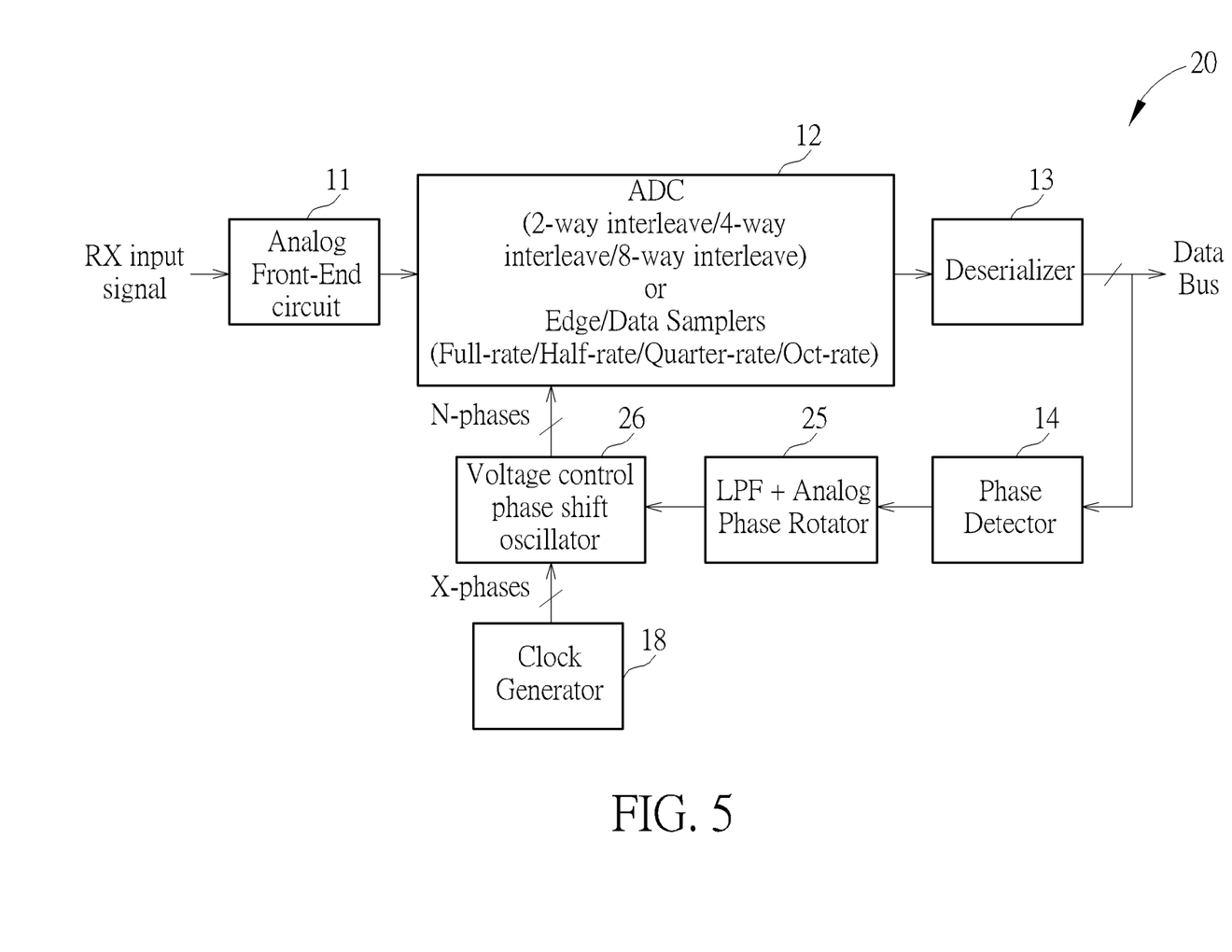
FIG. 5 is a diagram of an apparatus for performing phase shift control for timing recovery in an electronic device according to another embodiment of the present invention.

FIG. 5 is a diagram of an apparatus 20 for performing phase shift control for timing recovery in an electronic device according to another embodiment of the present invention, where the apparatus 20 of this embodiment may comprise some of the components in the architecture shown in FIG. 1. In comparison with the architecture shown in FIG. 1, the apparatus 20 may comprise a hybrid LPF circuit 25 having analog phase rotators embedded therein (labeled "LPF+Analog Phase Rotator" in FIG. 5, for brevity) that replaces the digital LPF 15 mentioned above, and may comprise a voltage control phase shift oscillator 26 that replaces the digital control phase shift oscillator 16 mentioned above. In addition, as the hybrid LPF circuit 25 is equipped with the analog phase rotators, the set of digital control signals mentioned above can be replaced by a set of analog control signals from the hybrid LPF circuit 25, where the phase shift corresponds to the set of analog control signals, and the set of analog control signals carries a set of analog weightings that replaces the set of digital weightings mentioned above, for selectively mixing the set of clock signals. For example, the voltage control phase shift oscillator 26 may comprise a set of clock receiving terminals such as that in the digital control phase shift oscillator 16, and may comprise a plurality of stages such as that in the digital control phase shift oscillator 16, and may further comprise one or more mixing circuits having analog control terminals (e.g. one or more injection circuits having the analog control terminals). The aforementioned one or more mixing circuits having analog control terminals may be arranged for selectively mixing the set of clock signals into one or more of the plurality of stages in the voltage control phase shift oscillator 26 according to the set of analog control signals. Additionally, the loop in the architecture shown in FIG. 5 (e.g. the loop formed with the sampling circuit 12, the deserializer 13, the phase detector 14, the hybrid LPF circuit 25, and the voltage control phase shift oscillator 26) may be regarded as a timing recovery loop. For brevity, similar descriptions for this embodiment are not repeated in detail here.

Figure 6:
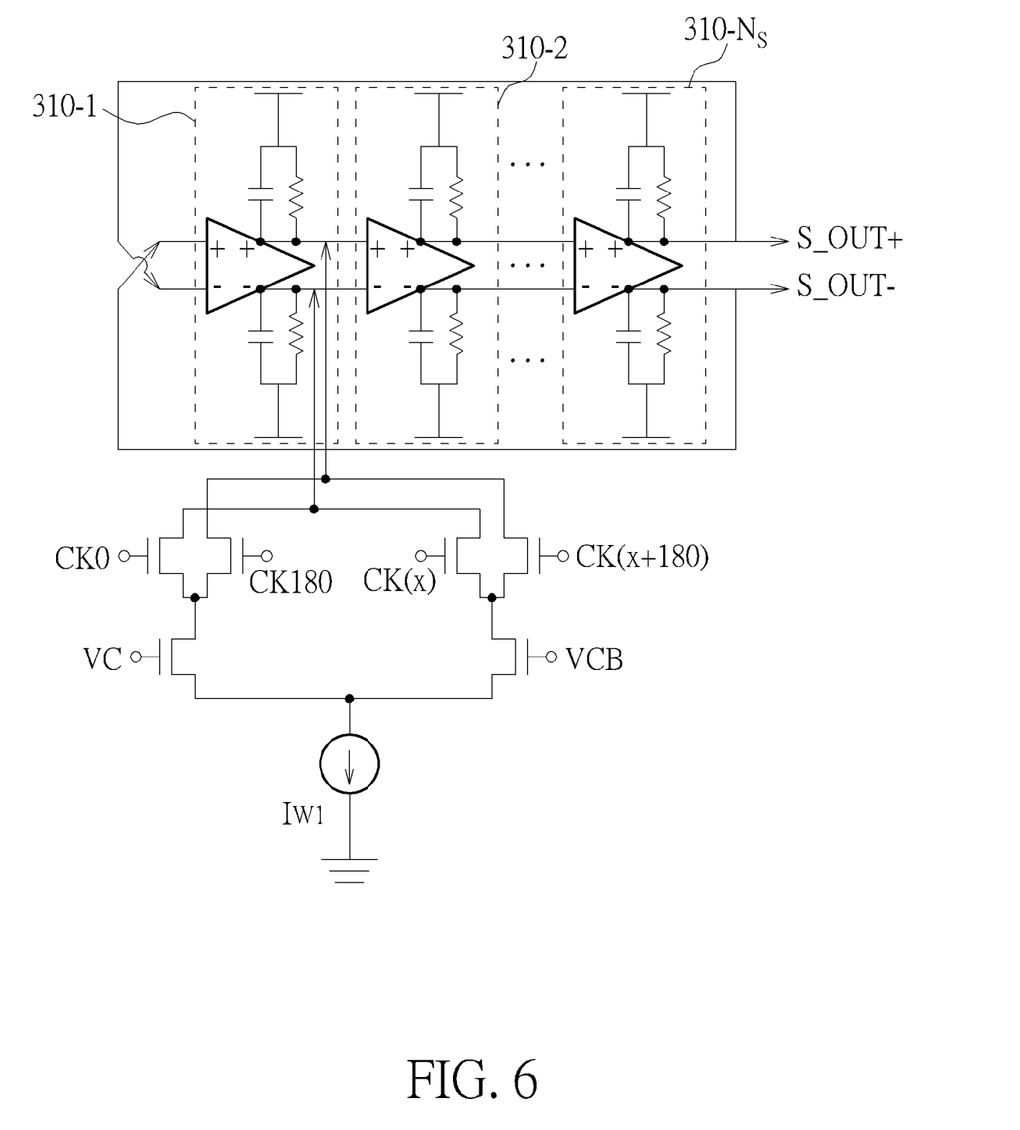
FIG. 6 illustrates a control scheme involved with the voltage control phase shift oscillator shown in FIG. 5 according to an embodiment of the present invention.

FIG. 6 illustrates a control scheme involved with the voltage control phase shift oscillator 26 shown in FIG. 5 according to an embodiment of the present invention. For example, the injection circuits INJ+ and INJ− shown in FIG. 3 may be replaced by analog injection circuits such as that in the lower half of the architecture shown in FIG. 6, for implementing the voltage control phase shift oscillator 26 shown in FIG. 5. According to this embodiment, the clock signal CK0 having the phase of 0°, the clock signal CK180 having the phase of 180°, the clock signal CK(x) having the phase of x°, and the clock signal CK(x+180) having the phase of (x+180)° can be taken as examples of the set of clock signals, and the clock terminals for receiving the clock signals CK0, CK180, CK(x), and CK(x+180) can be taken as examples of the set of clock receiving terminals of the voltage control phase shift oscillator 26. In addition, the voltage control terminals VC and VCB can be taken as examples of the analog control terminals of the aforementioned one or more mixing circuits in the voltage control phase shift oscillator 26. As shown in FIG. 6, different branches of the analog injection circuits may share the current $I_{WT}$ of the current source $I_{WT}$ that is electrically connected to these branches. For brevity, similar descriptions for this embodiment are not repeated in detail here.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing phase shift control for timing recovery in an electronic device, the method comprising:
generating an output signal of an oscillator, wherein a phase shift of the output signal of the oscillator is controlled by selectively combining a set of clock signals into the oscillator according to a set of digital control signals, and the set of clock signals is obtained from a clock generator, wherein the phase shift corresponds to the set of digital control signals, and the set of digital control signals carries a set of digital weightings for selectively mixing the set of clock signals; and
performing timing recovery and sampling on a receiver input signal of a receiver in the electronic device according to the output signal of the oscillator to reproduce data from the receiver input signal, wherein the reproduced data are reproduced at a data bus of the receiver, and the set of digital control signals is generated according to feedback signals from the data bus.

2. The method of claim 1, further comprising:
utilizing a digital low pass filter to perform digital low pass filtering on derivatives of the feedback signals to generate the set of digital control signals.

3. The method of claim 2, further comprising:
utilizing a phase detector to perform phase detection on the feedback signals from the data bus of the receiver to generate phase detection results, wherein the derivatives of the feedback signals comprise the phase detection results.

4. The method of claim 1, wherein the oscillator comprises a plurality of stages; and the phase shift of the output signal of the oscillator is controlled by selectively combining the set of clock signals into a specific stage of the plurality of stages according to the set of digital control signals.

5. The method of claim 4, wherein the phase shift of the output signal of the oscillator is controlled by injecting at least one portion of the set of clock signals into the specific stage according to the set of digital control signals, wherein a signal count of the at least one portion of the set of clock signals corresponds to the set of digital weightings carried by the set of digital control signals.

6. The method of claim 4, wherein the phase shift of the output signal of the oscillator is controlled by selectively combining the set of clock signals into the specific stage of the plurality of stages according to the set of digital control signals and by selectively combining another set of clock signals into another stage of the plurality of stages according to another set of digital control signals.

7. The method of claim 6, wherein the phase shift of the output signal of the oscillator is controlled by injecting at least one portion of the set of clock signals into the specific stage of the plurality of stages according to the set of digital control signals and by injecting at least one portion of the other set of clock signals into the other stage of the plurality of stages according to the other set of digital control signals, wherein a signal count of the at least one portion of the set of clock signals corresponds to the set of digital weightings carried by the set of digital control signals, and a signal count of the at least one portion of the other set of clock signals corresponds to a set of digital weightings carried by the other set of digital control signals.

8. The method of claim 6, wherein the other set of clock signals is equivalent to the set of clock signals.

9. The method of claim 4, wherein each stage of the plurality of stages comprises a voltage mode amplifier.

10. The method of claim 4, wherein each stage of the plurality of stages comprises a current mode amplifier.

11. An apparatus for performing phase shift control for timing recovery in an electronic device, the apparatus comprising at least one portion of the electronic device, the apparatus comprising:
an oscillator arranged to generate an output signal;
at least one mixing circuit, electrically connected to the oscillator, arranged to perform phase shift control on the output signal of the oscillator, wherein the at least one mixing circuit comprises a set of clock receiving terminals arranged to obtain a set of clock signals, and the at least one mixing circuit controls a phase shift of the output signal of the oscillator by selectively combining the set of clock signals into the oscillator according to a set of digital control signals, wherein the phase shift corresponds to the set of digital control signals, and the set of digital control signals carries a set of digital weightings for selectively mixing the set of clock signals;
a clock generator, arranged to generate the set of clock signals; and
a sampling circuit, positioned in a receiver in the electronic device, arranged to perform timing recovery and sampling on a receiver input signal of the receive according to the output signal of the oscillator to reproduce data from the receiver input signal, wherein the reproduced data are reproduced at a data bus of the receiver, and the set of digital control signals is generated according to feedback signals from the data bus.

12. The apparatus of claim 11, further comprising:
a digital low pass filter arranged to perform digital low pass filtering on derivatives of the feedback signals to generate the set of digital control signals.

13. The apparatus of claim 12, further comprising:
a phase detector arranged to perform phase detection on the feedback signals from the data bus of the receiver to generate phase detection results, wherein the derivatives of the feedback signals comprise the phase detection results.

14. The apparatus of claim 11, wherein the oscillator comprises a plurality of stages; and the at least one mixing circuit controls the phase shift of the output signal of the oscillator by selectively combining the set of clock signals into a specific stage of the plurality of stages according to the set of digital control signals.

15. The apparatus of claim 14, wherein the at least one mixing circuit controls the phase shift of the output signal of the oscillator by injecting at least one portion of the set of clock signals into the specific stage according to the set of digital control signals, wherein a signal count of the at least one portion of the set of clock signals corresponds to the set of digital weightings carried by the set of digital control signals.

16. The apparatus of claim 14, wherein the at least one mixing circuit further comprises:

another set of clock receiving terminals arranged to obtain another set of clock signals;

wherein the at least one mixing circuit controls the phase shift of the output signal of the oscillator by selectively combining the set of clock signals into the specific stage of the plurality of stages according to the set of digital control signals and by selectively combining the other set of clock signals into another stage of the plurality of stages according to another set of digital control signals.

17. The apparatus of claim 16, wherein the at least one mixing circuit controls the phase shift of the output signal of the oscillator by injecting at least one portion of the set of clock signals into the specific stage of the plurality of stages according to the set of digital control signals and by injecting at least one portion of the other set of clock signals into the other stage of the plurality of stages according to the other set of digital control signals, wherein a signal count of the at least one portion of the set of clock signals corresponds to the set of digital weightings carried by the set of digital control signals, and a signal count of the at least one portion of the other set of clock signals corresponds to a set of digital weightings carried by the other set of digital control signals.

18. The apparatus of claim 16, wherein the other set of clock signals is equivalent to the set of clock signals.

19. The apparatus of claim 14, wherein each stage of the plurality of stages comprises a differential amplifier or a single-end amplifier.

* * * * *

UNITED STATES PATENT AND TRADEMARK OFFICE
CERTIFICATE OF CORRECTION

PATENT NO.        : 9,608,798 B2
APPLICATION NO.   : 15/194509
DATED             : March 28, 2017
INVENTOR(S)       : Yan-Bin Luo et al.

It is certified that error appears in the above-identified patent and that said Letters Patent is hereby corrected as shown below:

On the Title Page

Item (73), correct the country of the assignee from "Hsin-Chu, Taiwan (CN)" to --Hsin-Chu (TW)--.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*